United States Patent
Kondo (10) Patent No.: US 10,060,987 B2
(45) Date of Patent: Aug. 28, 2018

(54) METHODS AND APPARATUS FOR MEASURING THE REMAINING CAPACITY OF A BATTERY

(71) Applicant: SEMICONDUCTOR COMPONENTS INDUSTRIES, LLC, Phoenix, AZ (US)

(72) Inventor: Hideo Kondo, Ora-gun (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/355,525

(22) Filed: Nov. 18, 2016

(65) Prior Publication Data
US 2018/0143253 A1 May 24, 2018

(51) Int. Cl.
G01N 27/416 (2006.01)
G01R 31/36 (2006.01)
H02J 7/00 (2006.01)

(52) U.S. Cl.
CPC ..... *G01R 31/3624* (2013.01); *G01R 31/3651* (2013.01); *G01R 31/3662* (2013.01); *G01R 31/3675* (2013.01); *G01R 31/3679* (2013.01); *H02J 7/0068* (2013.01)

(58) Field of Classification Search
CPC .................................................. G01N 27/416
USPC ........................................................ 324/426
See application file for complete search history.

(56) References Cited

U.S. PATENT DOCUMENTS

| 6,768,288 | B2* | 7/2004 | Rosenquist | G01R 31/3624 320/132 |
|---|---|---|---|---|
| 2011/0074433 | A1 | 3/2011 | Zhang | |
| 2012/0181991 | A1 | 7/2012 | Gofman | |
| 2012/0212176 | A1* | 8/2012 | Park | B60L 3/0046 320/107 |
| 2013/0045404 | A1 | 2/2013 | Shi | |
| 2013/0224532 | A1* | 8/2013 | Bengtsson | H01M 2/1072 429/7 |
| 2016/0049807 | A1* | 2/2016 | Thompson | H02J 7/0004 320/162 |

FOREIGN PATENT DOCUMENTS

JP  11-148966  6/1999

* cited by examiner

*Primary Examiner* — Bot Ledynh
(74) *Attorney, Agent, or Firm* — The Noblitt Group, PLLC; Hettie L. Haines (57) ABSTRACT

Various embodiments of the present technology may comprise a method and apparatus to measure the remaining capacity of a battery. The method and apparatus may comprise utilizing various parameters, such as internal resistance, temperature, and aging characteristics to calculate the remaining capacity of the battery. According to various embodiments, the internal resistance and temperature of the battery are periodically measured. According to various embodiments, each time a new internal resistance is measured, the new the internal resistance becomes the new baseline for calculating the remaining capacity of the battery.

20 Claims, 6 Drawing Sheets

FIG.5

METHODS AND APPARATUS FOR MEASURING THE REMAINING CAPACITY OF A BATTERY

BACKGROUND OF THE TECHNOLOGY

"Battery capacity" is a measure (typically in ampere hours) of the charge stored by the battery, and is determined by the mass of active material contained in the battery. The present battery capacity (i.e., relative state of charge) can also be expressed as a percentage of the maximum capacity of the battery. The maximum battery capacity represents the maximum amount of energy that can be extracted from the battery under certain specified conditions. The actual energy storage capabilities of the battery, however, can vary significantly from the "nominal" rated capacity.

The battery capacity depends, in part, on the age of the battery. As the battery ages, the internal resistance of the battery increases, thereby affecting the battery capacity.

The charging/discharging rates also affect the rated battery capacity. If the battery is being discharged very quickly (i.e., the discharge current is high), then the amount of energy that can be extracted from the battery is reduced and the battery capacity is lower. This is because the necessary components for the reaction do not have enough time to move to their necessary positions. Only a fraction of the total reactants are converted to other forms, and therefore reducing the available energy. Alternatively, when the battery is discharged at a very slow rate using a low current, more energy can be extracted from the battery and the battery capacity is higher.

The temperature of a battery directly affects the internal resistance of the battery and the energy that can be extracted from it. At higher temperatures, the battery capacity is typically higher than at lower temperatures.

Conventional methods for measuring the battery capacity are prone to errors since they require a known starting point. Conventional methods also do not account for how aging affects the internal resistance of the battery over time, and thus its ability to retain charge.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various temperature sensors, processing units, computations, algorithms, and the like, which may carry out a variety of functions. In addition, the present technology may be practiced in conjunction with any number of systems, such as systems employed in consumer electronics, automotive systems, consumer wearables, emergency charging systems, and the like, and the systems described are merely exemplary applications for the technology. Further, the present technology may employ any number of conventional techniques for measuring voltage, measuring current, measuring temperature, and the like.

Methods and apparatus for measuring the remaining capacity of a battery according to various aspects of the present technology may operate in conjunction with any suitable battery-operated apparatus. For example, the apparatus may comprise a cellular phone, a computer, a tablet, or a camera. For example, referring to FIG. 1, an exemplary embodiment of methods and apparatus for measuring the remaining capacity of a battery may operate in conjunction with a system, such as a cellular phone or other communication system, comprising a battery capacity unit 105 and a battery pack 110. The system may further comprise additional elements, such as a display unit 112, a power supply regulator circuit 116, a system LSI (Large Scale Integration) circuit 114, and an operation unit 113. According to various embodiments, the system may also comprise other elements, such as a secondary battery 115 to operate a real-time clock circuit (not shown) and/or to update time of the cellular phone when the cellular phone is turned off.

Figure 1:
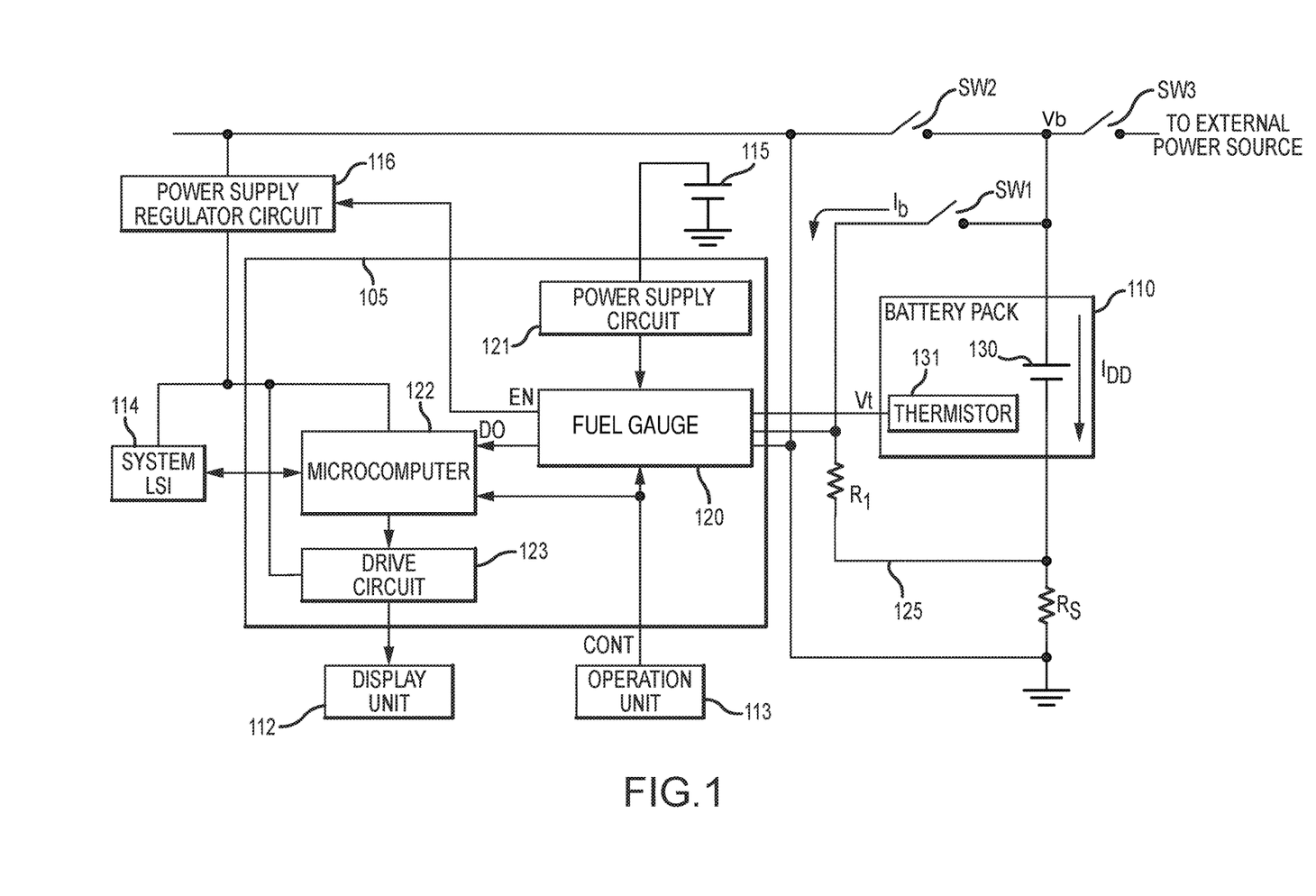
FIG. 1 is a block diagram of a battery system in accordance with an exemplary embodiment of the present technology.

The battery pack 110 may be a power supply for the cellular phone, and may comprise a battery 130, such as a chargeable lithium ion battery. In an exemplary embodiment, the battery 130 generates an output voltage $V_b$ between a negative electrode and a positive electrode of the battery 130.

The battery pack 110 may also comprise a temperature sensor that provides a signal according to the temperature of the battery 130. In the present embodiment, the temperature sensor comprises a thermistor 131 that generates a voltage $V_t$ corresponding to a temperature of the battery 130. The temperature sensor may, however, comprise any appropriate sensor or other device or system for generating a signal corresponding to the temperature of the battery 130.

The display unit 112 displays information regarding the device. The display unit 112 may comprise any appropriate display for the particular application and/or environment, for example a conventional display, such as a liquid crystal panel, provided in a cellular phone to display characters, images, and the like.

The operation unit 113 provides an interface for the user to control the device, and may comprise any suitable control interface for the particular device or application. For example, the operation unit 113 may comprise a keypad having one or more buttons of various types, such as a dial key, a power key and the like (not shown), to operate the cellular phone, and outputs control data CONT according to the operation of the keypad, for example. If a user manipulates the power key in the operation unit 113 in order to start the cellular phone, for example, the control signal CONT to start the cellular phone is outputted from the operation unit 113. The operation unit 113 may comprise any appropriate interface for facilitating user control, such as a conventional keypad, a touchscreen, a voice recognition system, and/or a gaze-operated input system.

The system LSI circuit 114 performs the communication functions of the device. The system LSI circuit 114 may comprise any suitable system for the particular device or application, such as cell phone communication circuits, programmable logic devices, memory devices, and the like. In the present embodiment, the system LSI circuit 114 comprises a large scale integration circuit to realize various functions, for example communication in the cellular phone.

The power supply regulator circuit 116 may generate one or more power supply voltages for powering the various elements of the device. For example, the power supply regulator circuit 116 may be capable of powering the system LSI circuit 114 and other system elements based on the output voltage $V_b$ of the battery 130 and/or power from an external power source. The power supply regulator circuit 116 may comprise a conventional power supply regulation system for providing appropriate voltages and currents for the various elements.

The system may further comprise connections for charging or discharging the battery 130. The charge and discharge functions may be controlled in any suitable manner, such as using second and third switches SW2, SW3 to control the charging or discharging operation of the battery 130. When the second switch SW2 is closed and the third switch SW3 is open, the battery 130 is discharging and providing power to the system. When the second switch SW2 is open and the third switch SW3 is closed, the battery 130 is charging. Both switches SW2, SW3 may both be open to stop the charging and discharging operations.

The battery capacity unit 105 generates a signal indicating the remaining life of the battery. The battery capacity unit 105 may calculate the remaining life of the battery and provide the information, such as via the display or an audible signal, and may comprise any suitable elements for calculating the remaining life of the battery and providing the information to the user. For example, the present battery capacity unit 105 comprises a microcomputer 122, a drive circuit 123, a third power supply circuit 121, and a fuel gauge 120.

The microcomputer 122 may control the cellular phone, such as based on the control signal CONT from the operation unit 113, and may comprise any appropriate system, such as a conventional controller or processor. Further, the microcomputer 122 may transfer data DO outputted from the fuel gauge 120 to the drive circuit 123 configured to drive the display unit 112. The drive circuit 123 may drive the display unit 112 so that the remaining capacity, the temperature of the battery 130, and the like, can be displayed on the display unit 112 based on the data DO from the microcomputer 122.

The third power supply circuit 121 may to generate a power supply voltage to operate the fuel gauge 120, for example from the secondary battery 115. In various embodiments, the system may further comprise a timing unit (not shown) to operate various circuits according to a predetermined timing cycle.

The fuel gauge 120 may calculate the remaining life of the battery 130 and generate the corresponding DO signal. For example, the DO signal may represent a ratio of the remaining capacity of the battery 130 to the total effective capacity of the battery 130 (hereinafter referred to as a relative state of charge (RSOC)). The fuel gauge 120 may comprise any appropriate elements to calculate the RSOC of the battery 130. In the present embodiment, the fuel gauge 120 may calculate the RSOC of the battery 130 based on various factors that affect battery 130 life. For example, the fuel gauge 120 may receive data regarding the current temperature and the charge/discharge state of the battery 130. The fuel gauge 120 may calculate the RSOC based on the received data and a calculated internal resistance of the battery 130.

In the present exemplary embodiment, the fuel gauge 120 may measure a first current $I_{DD}$ of the battery 130. The fuel gauge 120 may also measure the battery 130 output voltage $V_b$ to obtain a first output voltage $V_{b1}$.

The fuel gauge 120 may also measure a second current $I_b$ of the battery 130 through a sensing circuit, such as a switchable sensing circuit 125. In the present embodiment, the fuel gauge 120 halts the charging/discharging operation by opening the switches SW2, SW3 and closing the switch SW1. The fuel gauge 120 may measure the second current $I_b$ through the switchable sensing circuit 125.

The fuel gauge 120 may establish a baseline internal resistance $R_{int\_base}$. The fuel gauge 120 may also establish a baseline temperature, for example via the thermistor 131.

The fuel gauge 120 may utilize the baseline temperature $T_{base\_N}$ and baseline internal resistance $R_{int\_base}$, along with stored data to determine an aging characteristic for the battery 130. The fuel gauge 120 may also utilize the first current $I_{DD}$ and the internal resistance $R_{int}$ to calculate an adjusted output voltage $V_{b\_adj}$, according to the internal resistance $R_{int}$ and the first current $I_{DD}$.

The fuel gauge 120 may utilize stored data to determine the RSOC of the battery. For example, the fuel gauge 120 may match the adjusted output voltage $V_{b\_adj}$ to a corresponding RSOC according to data contained in a predetermined look-up table. The fuel gauge 120 may then provide a corresponding RSOC value to the display unit 112 for display, such as in the form of a percentage.

Figure 2:
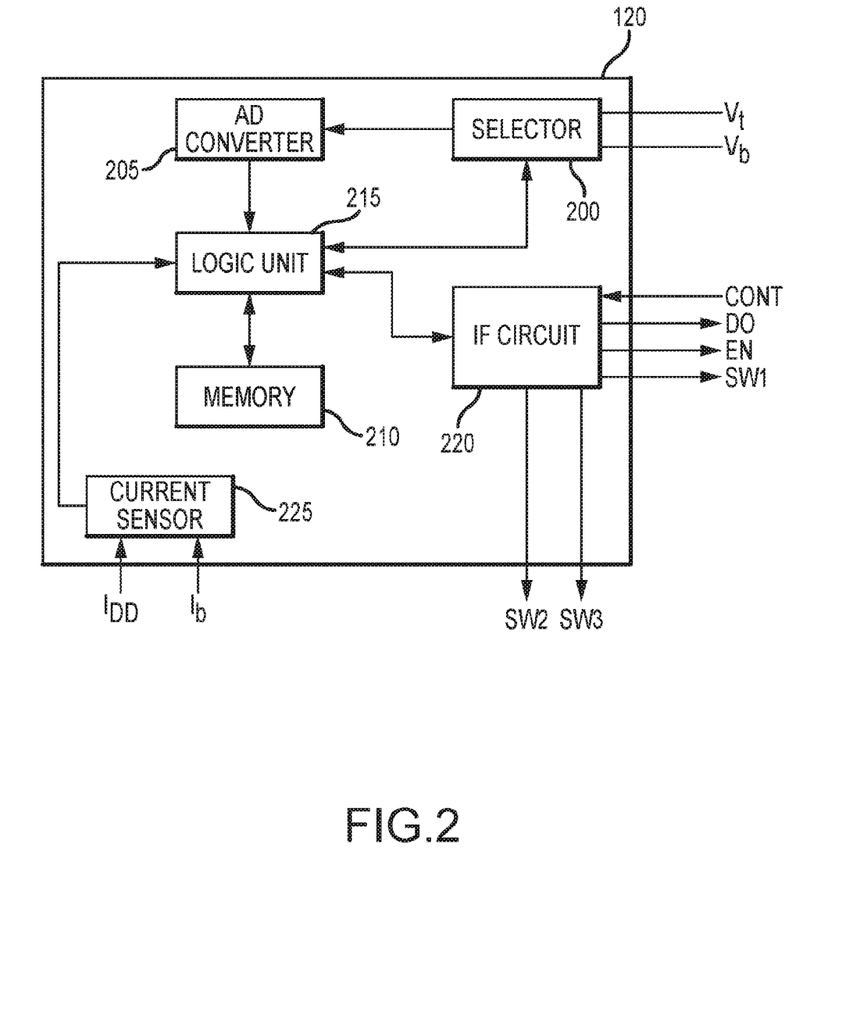
FIG. 2 is a block diagram of a fuel gauge in accordance with an exemplary embodiment of the present technology.

For example, referring to FIG. 2, the fuel gauge 120 may comprise a memory 210, a logic unit 215, and a current sensor 225. The fuel gauge 120 may further comprise a selector 200, an AD converter 205, and an interface (IF) circuit 220. The selector 200 may comprise a circuit to select a signal, such as the output voltage $V_b$ or thermistor voltage $V_t$, to be outputted to the AD converter 205 based on an instruction from the logic unit 210.

The AD converter 205 may convert the output voltage $V_b$ and/or thermistor voltage $V_t$ output from the selector 200 into a digital voltage value DAT. The AD converter 205 may comprise any appropriate analog-to-digital architecture, and may be selected based on a particular application. The IF circuit 220 may comprise a circuit to exchange various data between the logic unit 215 and the operation unit 113, the power supply regulator circuit 116, and the microcomputer 122. The IF circuit 220 may also transmit signals to operate the first switch SW1, the second switch SW2, and the third switch SW3.

The current sensor 225 may measure various currents in the system. In an exemplary embodiment, the current sensor 225 measures a first current $I_{DD}$ and a second current $I_b$ through the battery 130. Each current $I_{DD}$, $I_b$ may be measured at various times and at different time intervals. The current sensor 225 may detect if the battery 130 is charging or discharging based on the value of the current $I_{DD}$. For example, the current $I_{DD}$ may have a negative value if the battery 130 is discharging and the current $I_{DD}$ may have a positive value if the battery is charging.

The switchable sensing circuit 125 may be used to selectively measure the second current $I_b$ from the battery 130, such as when the battery 130 is neither charging or discharging. The switchable sensing circuit 125 may comprise a first switch SW1 for selective activation and a resistor $R_1$. The switchable sensing circuit 125 may be coupled between the battery 130 and the battery capacity unit 105.

The logic unit 215 may control the fuel gauge 120 and realize various functions by executing various programs stored in the memory 210. For example, the logic unit 215 may perform various calculations, such as calculating the product of two values. The logic unit 215 may also receive information regarding the first and second measured currents $I_{DD}$, $I_b$ and the charge/discharge state of the battery 130, as well as data and stored in the memory 210.

Figure 3:
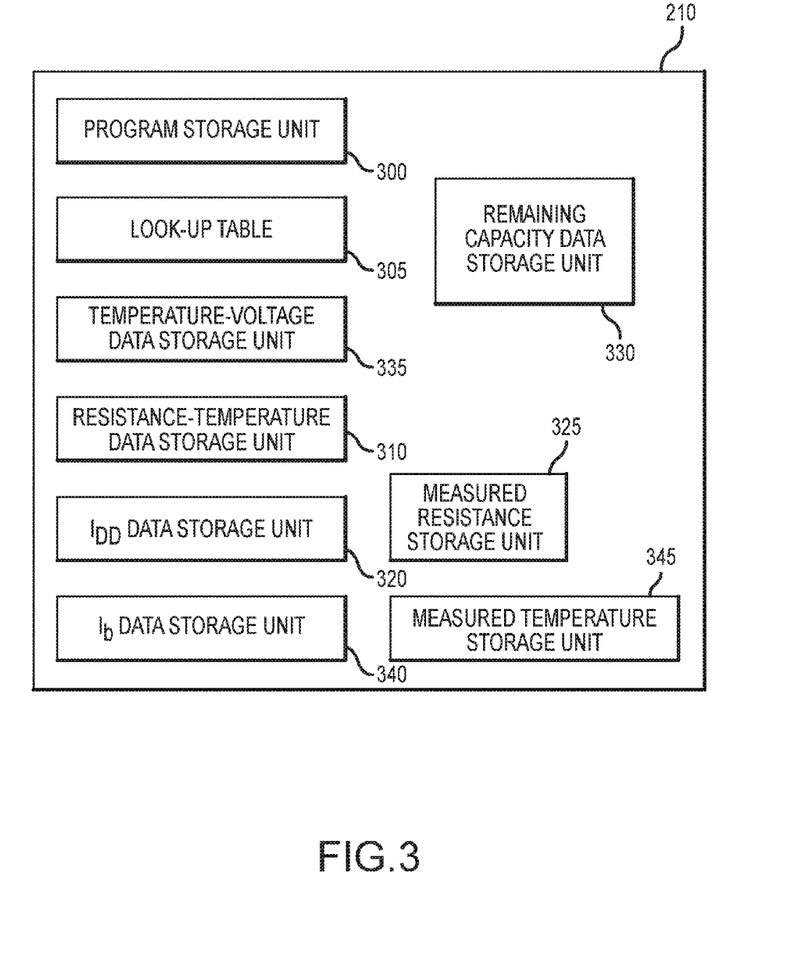
FIG. 3 is a block diagram of a memory unit in accordance with an exemplary embodiment of the present technology.

Referring to FIG. 3, the memory 210 may comprise a circuit to store programs to be executed by the logic unit 215 and various types of data. In an exemplary embodiment, the memory 210 may comprise ROM (read only memory) and RAM (random access memory). The storage area of the memory 210 may be provided with a program storage unit 300 to store programs to operate the logic unit 215; a look-up table 305 to store data which is required by the logic unit 215 to calculate the remaining capacity of the battery 130; a temperature-voltage data storage unit 335 to store data, such as a look up-table, indicating the relationship between voltage and temperature; a resistance-temperature data storage unit 310 to store data, such as a look-up table, indicating the relationship between internal resistance and temperature; and a current data storage unit 320 to store the value of the current $I_{DD}$ and the charge/discharge state of the battery 130.

Figure 4:
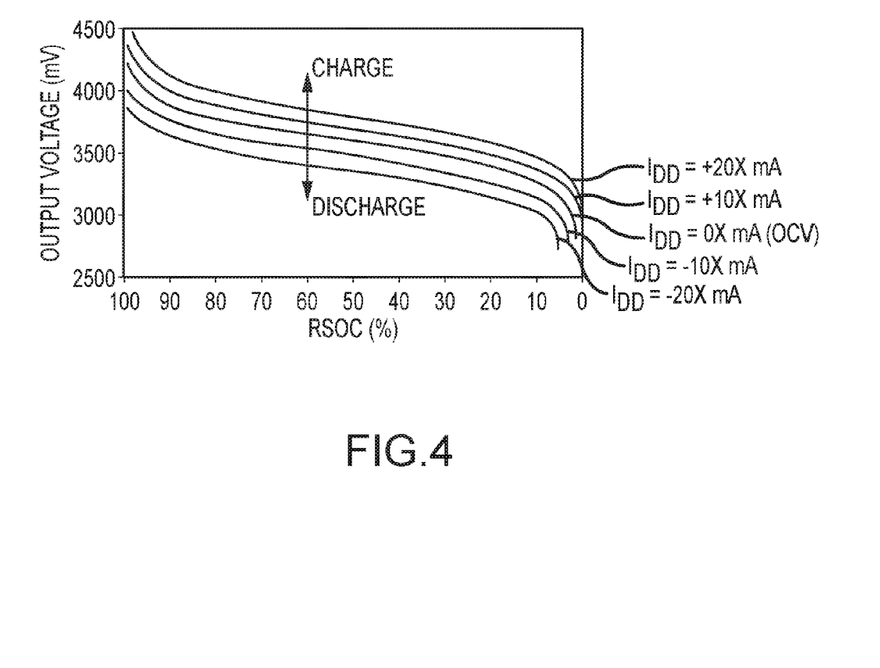
FIG. 4 is a graph illustrating a relationship between voltage, current, and remaining capacity of a battery in accordance with an exemplary embodiment of the present technology.

Referring to FIG. 4, the look-up table 305 may comprise data that describes the relationship between the output voltage $V_b$ and the RSOC. The look-up table 305 may comprise open circuit voltage (OCV) characteristics at a specified temperature, for example 20 degrees Celsius. When graphed, the OCV characteristics may be referred to as an OCV curve. The OCV curve (characteristics) may be used as a starting point for measuring the remaining capacity of the battery 130. For example, given a particular output voltage $V_b$, if the battery 130 is charging, the OCV curve may be adjusted up, or if the battery 130 is discharging, the OCV curve may be adjusted down. The amount that the curve is adjusted up or down depends on the magnitude of the current $I_{DD}$.

The temperature-voltage data storage unit 335 may further comprise data indicating a relationship between the thermistor voltage $V_t$ and temperature. For example, the temperature-voltage data may be converted to a look-up table.

The resistance-temperature data storage unit 310 may comprise data indicating a relationship between an internal resistance $R_{int}$ (m-ohms) and the temperature T of the battery. For example, referring to FIG. 5, the data may reflect how resistance varies with temperature and battery age. For example, the resistance-temperature data, such as the data illustrated in FIG. 5, may be converted into a look-up table. In general, as the battery 130 ages (deteriorates), the resistance increases across all temperatures.

The memory 210 may further comprise a remaining capacity data storage unit 330 to store RSOC data, for example indicating a ratio of the remaining capacity of the battery 130 to the total effective capacity of the battery 130.

The memory 210 may further comprise a measured resistance storage unit 325 to store the most recently measured internal resistance $R_{int}$, and a measured temperature storage unit 345 to store the most recently measured temperature T. The values of the internal resistance $R_{int}$ and the temperature may be updated periodically. For example, the internal resistance $R_{int}$ value may be updated once every six months, and the temperature T value may be updated multiple times per minute.

For example, referring to FIGS. 1 through 6, in operation, the fuel gauge 120 may calculate the RSOC of the battery 130 based on various factors, such as the temperature of the battery 130, the internal resistance $R_{int}$ of the battery 130, and the charge/discharge state of the battery 130. The fuel gauge 120 may update the value of the internal resistance $R_{int}$ of the battery 130 periodically, for example a timing frequency of once a year, or once every six months. The fuel gauge 120 may, however, update the temperature information almost continuously, for example a timing frequency of every 10 seconds. According to various embodiments, the fuel gauge 120 may utilize the most recently measured internal resistance $R_{int}$ as a baseline for calculating the RSOC.

Figure 6:
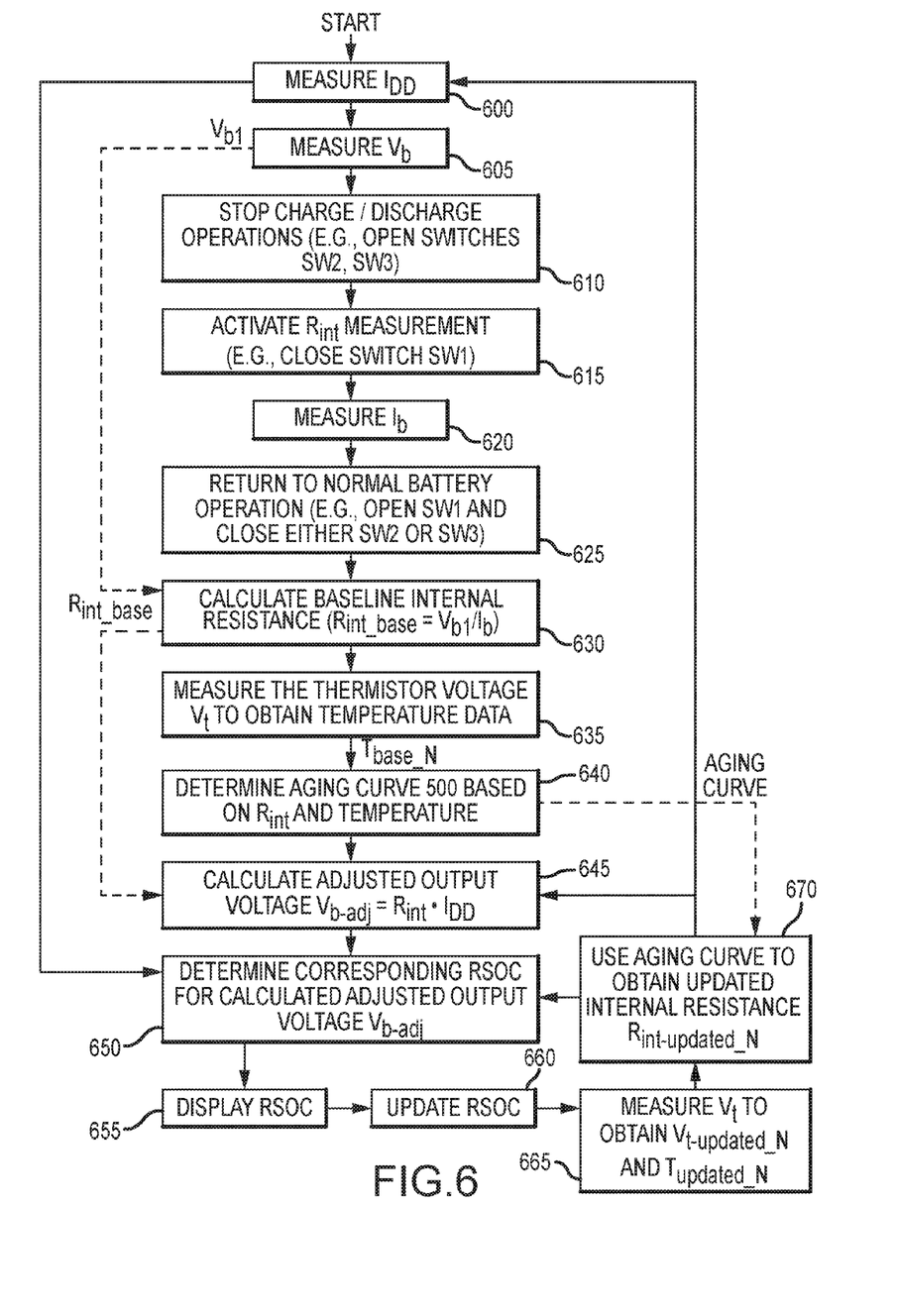
FIG. 6 is a flow chart for determining the remaining capacity of a battery in accordance with an exemplary embodiment of the present technology.

In an exemplary embodiment, the current sensor 225 measures the first current $I_{DD}$(600) of the battery 130 to determine a numerical value and to determine if the battery 130 is charging or discharging, which can be determined by the direction of the first current $I_{DD}$ flow.

The output voltage $V_b$ is also measured to obtain the first output voltage $V_{b1}$ (605). For example, the selector 200 may receive the output voltage $V_b$ of the battery 130 and convert the voltage to a digital value via the AD converter 205. A digital value representing the output voltage $V_b$ may be transmitted to the logic unit 215.

The charging/discharging operation may be halted by opening the second and third switches SW2, SW3 (610), and the switchable sensing circuit 125 may be activated (615), for example by closing the first switch SW1, so that the second current $I_b$ through the switchable sensing circuit 125 can be measured (620).

After the output voltage $V_b$ and the second current $I_b$ are measured, the battery capacity unit 105 may resume normal operation (625). For example, the first switch SW1 may reopen and either one of the second or third switches SW2, SW3 may close, depending on the charging/discharging status of the battery.

Once the output voltage $V_b$, and the second current $I_b$ values are known, a baseline internal resistance $R_{int\_base}$ may be calculated (i.e., $R_{int\_base}=V_{b1}/I_b$) (630). The measured resistance storage unit 325 may store the calculated baseline internal resistance $R_{int\_base}$. A corresponding baseline temperature $V_{t\_base}$ is measured to obtain a baseline temperature $T_{base\_N}$ (635). For example, the selector 200 may receive the thermistor voltage $V_t$ from the thermistor 131 and the AD converter 205 may convert the thermistor voltage $V_t$ to a digital value. A digital value representing the thermistor voltage $V_t$ may be transmitted to the logic unit 215 and stored in the memory 210. The temperature-voltage data storage unit 335 may convert the thermistor voltage $V_t$ to the baseline temperature $T_{base\_N}$, for example measured in degrees Celsius.

Figure 5:
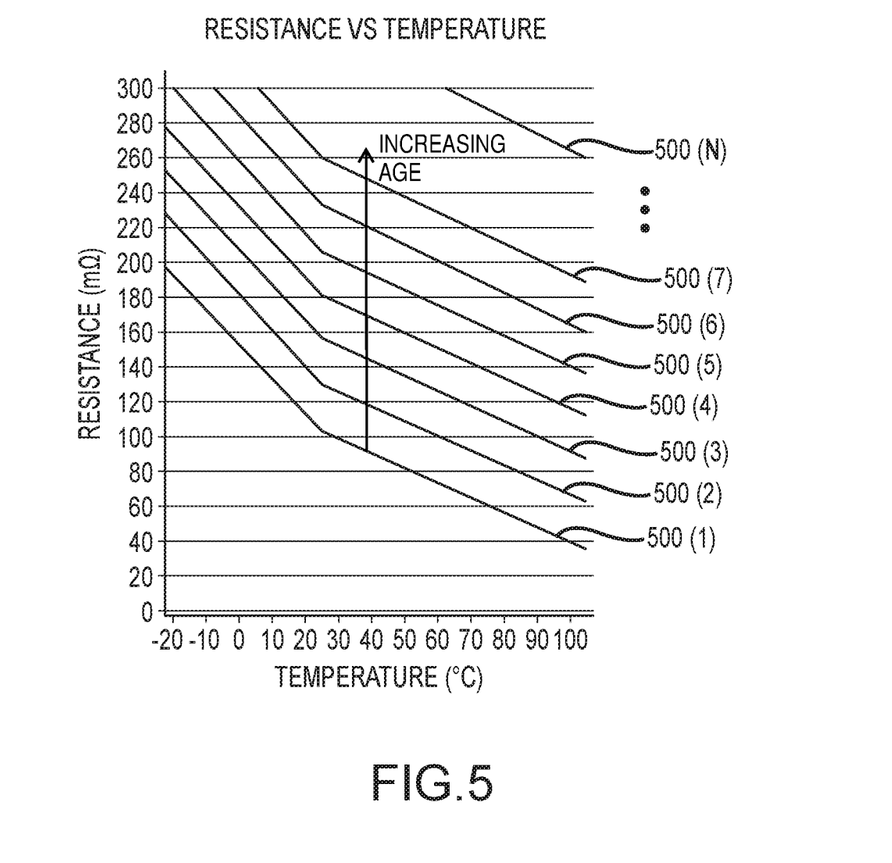
FIG. 5 is a graph illustrating a relationship between resistance and temperature in accordance with an exemplary embodiment of the present technology.

The logic unit 215 may utilize the baseline temperature $T_{base\_N}$ and baseline internal resistance $R_{int\_base}$, along with the data from the resistance-temperature data storage unit 310 to determine an aging curve 500 for the battery 130 (640). For example, if the baseline internal resistance $R_{int\_base}$ is measured at 160 m-ohms and the baseline temperature $V_{t\_base}$ is measured at 10 degrees Celsius, then the aging curve 500 for this point is selected. In this example, the second aging curve 500(2) is selected. In an exemplary embodiment, the process of measuring the second current $I_b$ and calculating the baseline internal resistance $R_{int\_base}$ may be performed periodically, wherein each time a new baseline internal resistance $R_{int\_base}$ may be calculated and saved in the measured resistance storage unit 325.

The logic unit 215 may utilize the numerical value for the first current $I_{DD}$ and the internal resistance $R_{int}$ to calculate an adjusted output voltage $V_{b\_adj}$, where the adjusted output voltage equals the product of the internal resistance $R_{int}$ and the first current $I_{DD}$ (i.e., $V_{b\_adj}=R_{int}*I_{DD}$) (645). The logic unit 215 may utilize the most recently calculated baseline internal resistance $R_{int\_base}$ to calculate the adjusted output voltage $V_{b\_adj}$.

The logic unit 215 may utilize data from the remaining capacity data storage unit 330 to determine the RSOC of the battery (650). The adjusted output voltage $V_{b\_adj}$ may be matched to the corresponding RSOC according to the data contained in the predetermined look-up table 305. For example, referring to FIG. 4, if the first current $I_{DD}$ was measured at +20X mA (where X is a shift factor based on the battery specifications, such as the capacity of the battery) and the calculated adjusted output voltage $V_{b\_adj}$ is 4000 mV, then the RSOC is approximately 80 percent. The display unit 112 may then display the RSOC value (655), for example as a percentage.

In an exemplary embodiment, the battery capacity unit 105 may update the RSOC almost continuously (660), for example, every 30 seconds. After the battery capacity unit 105 obtains the baseline internal resistance $R_{int\_base}$, that value may be updated (i.e., a $R_{int\_updated\_N}$) as the temperature T of the battery 130 changes. In an exemplary embodiment, the logic unit 215 may update the temperature T of battery 130 to obtain an updated temperature $T_{updated\_N}$ (665). For example, the thermistor voltage $V_t$ may be measured again to obtain the updated temperature $T_{updated\_N}$.

After the battery capacity unit 105 obtains the updated temperature $T_{updated\_N}$, the baseline internal resistance $R_{int\_base}$ may be updated. The updated temperature $T_{updated\_N}$ may be used in conjunction with the most-recently selected aging curve 500 to obtain the updated internal resistance $R_{int\_updated\_N}$. Continuing with the previous example where the baseline internal resistance $R_{int\_base}$ was measured at 160 m-ohms and the baseline temperature $V_{t\_base}$ was measured at 10 degrees Celsius, if the updated temperature $T_{updated\_N}$ is measured at 55 degrees Celsius, this temperature corresponds to a resistance of 100 m-ohms on the second aging curve 500(2). Therefore, the updated internal resistance $R_{int\_updated\_N}$ is 100 m-ohms.

The logic unit 215 may utilize the updated internal resistance $R_{int\_updated\_N}$ to recalculate the RSOC by recalculating the adjusted output voltage $V_{b\_adj}$. The battery capacity unit 105 may update the RSOC according to the predetermined timing frequency, for example battery capacity unit 105 may update and display the RSOC every 30 seconds.

The relationship between temperature and internal resistance $R_{int}$ is such that as the temperature increases, the internal resistance $R_{int}$ decreases, decreasing the adjusted output voltage $V_{b\_adj}$. Since the adjusted output voltage $V_{b\_adj}$ takes into account the internal resistance $R_{int}$ of the battery 130, the RSOC is a function of temperature, internal resistance and current, and is more accurate than methods where the internal resistance $R_{int}$ is not considered.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A circuit for determining the remaining capacity of a battery, comprising:
   a temperature sensor responsive to a temperature of the battery;
   a current sensor responsive to a current of the battery;
   a voltage sensor responsive to an output voltage of the battery;

a memory device, wherein the memory device stores:
  remaining capacity data indicating a relationship between the output voltage of the battery, a remaining capacity of the battery, and the current of the battery; and
  internal resistance data indicating a relationship between an internal resistance of the battery and the temperature of the battery; and
a logic unit responsive to the temperature sensor, the current sensor, and the voltage sensor and having access to the memory device, wherein the logic unit is configured to calculate:
  the internal resistance of the battery based on the temperature of the battery;
  an adjusted output voltage based on the internal resistance; and
  a remaining capacity of the battery based on the adjusted output voltage and the remaining capacity data.

2. The circuit according to claim 1, further comprising a switching element coupled to the battery to disable one of a charge and discharge operation of the battery.

3. The circuit according to claim 1, further comprising a switchable current sensing circuit coupled to the battery, wherein the switchable sensing circuit comprises a switch and a resistor.

4. The circuit according to claim 3, wherein the output voltage of the battery is measured when the switchable sensing circuit is off.

5. The circuit according to claim 3, wherein a second current value of the battery is measured when the switchable sensing circuit is on.

6. The circuit according to claim 1, further comprising an analog to digital converter coupled to the temperature sensor and the voltage sensor.

7. The circuit according to claim 1, wherein the current sensor measures a second current of the battery, and the logic unit establishes a baseline internal resistance of the battery utilizing the output voltage and the second current of the battery.

8. The circuit of according to claim 7, wherein the temperature sensor measures a baseline temperature of the battery.

9. The circuit according to claim 8, wherein the logic unit utilizes the baseline internal resistance and the baseline temperature to establish an aging characteristic.

10. The circuit according to claim 9, wherein the aging characteristic is further established using the internal resistance data.

11. A method for monitoring the capacity of a battery, comprising:
  measuring a first current of the battery;
  measuring an output voltage of the battery;
  activating a switchable sensing circuit connected to the battery;
  measuring a second current through the switchable sensing circuit;
  measuring a temperature of the battery;
  calculating an internal resistance of the battery based on the second current and the output voltage of the battery;
  calculating an adjusted output voltage of the battery based on the current and the internal resistance of the battery; and
  determining a remaining capacity based on the adjusted output voltage and a predetermined look-up table.

12. The method of claim 11, further comprising determining an aging characteristic based on the temperature and the internal resistance of the battery.

13. The method of claim 11, further comprising:
  determining an updated remaining capacity according to a first predetermined timing frequency;
  determining an updated internal resistance according to a second predetermined timing frequency; and
  determining an updated temperature according to a third predetermined timing frequency, wherein the first predetermined timing frequency is greater than the third predetermined timing frequency and less than the second predetermined timing frequency.

14. The method of claim 11, further comprising disabling both a charge operation and a discharge operation of the battery prior to measuring the second current.

15. A system for monitoring the capacity of a battery, comprising:
  a temperature sensor responsive to a temperature of the battery;
  a current sensor adapted to measure a first current and a second current delivered by the battery;
  a voltage sensor adapted to measure an output voltage of the battery;
  a memory, wherein the memory stores:
    remaining capacity data indicating a relationship between the output voltage, a remaining capacity of the battery, and the first current of the battery; and
    internal resistance data indicating a relationship between the internal resistance of the battery and the temperature of the battery;
  a switchable sensing circuit coupled to the battery, wherein the switchable sensing circuit is selectively activatable to measure the second current; and
  a logic unit responsive to the temperature sensor, the current sensor, and the voltage sensor, having access to the memory, and controlling the switchable sensing circuit, wherein the logic unit is configured to determine:
    a current internal resistance of the battery according to a baseline internal resistance of the battery, the temperature of the battery, and the internal resistance data;
    an adjusted output voltage based on the current internal resistance and the first current; and
    a remaining capacity of the battery based on the adjusted output voltage and the remaining capacity data.

16. The system of claim 15, further comprising a display unit coupled to the logic unit to display the remaining capacity of the battery.

17. The system of claim 15, further comprising a switching element coupled to the battery to disable one of a charge and discharge operation of the battery.

18. The system according to claim 15, wherein the first current value of the battery is measured when the switchable sensing circuit is off.

19. The system according to claim 15, wherein the output voltage of the battery is measured when the switchable sensing circuit is off.

20. The system according to claim 15, further comprising an analog to digital converter coupled to the temperature sensor and voltage sensor.

* * * * *